US012757466B2

(12) United States Patent
Shih

(10) Patent No.: US 12,757,466 B2
(45) Date of Patent: Oct. 6, 2026

(54) MANUFACTURING METHOD FOR A SEMICONDUCTOR STRUCTURE

(71) Applicant: Taiwan Semiconductor Manufacturing Company, Ltd., Hsinchu (TW)

(72) Inventor: Ding-Kang Shih, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 503 days.

(21) Appl. No.: 18/386,799

(22) Filed: Nov. 3, 2023

(65) Prior Publication Data

US 2025/0151356 A1 May 8, 2025

(51) Int. Cl.
*H10D 64/01* (2025.01)

(52) U.S. Cl.
CPC ......... *H10D 64/017* (2025.01); *H10D 64/021* (2025.01)

(58) Field of Classification Search
CPC .. H10D 64/017; H10D 64/021; H10D 30/019; H10D 30/501
See application file for complete search history.

(56) References Cited

U.S. PATENT DOCUMENTS

| | | | | |
|---|---|---|---|---|
| 10,699,965 | B1 * | 6/2020 | Greene | H10D 84/0172 |
| 2014/0199845 | A1 * | 7/2014 | Choi | H10D 64/017 438/696 |
| 2024/0282569 | A1 * | 8/2024 | Lo | H10D 30/014 |
| 2025/0318178 | A1 * | 10/2025 | Huang | H10D 30/6735 |

* cited by examiner

*Primary Examiner* — Thanh T Nguyen
(74) *Attorney, Agent, or Firm* — Birch, Stewart, Kolasch & Birch, LLP

(57) ABSTRACT

A manufacturing method includes the following steps: forming a semiconductor structure, wherein the semiconductor structure comprises a wafer, a plurality of dummy gates and a dielectric layer, and the dummy gates are formed on the wafer, and the dielectric layer is formed on the dummy gates; forming an epitaxy layer between adjacent two of the dummy gates, wherein there is a nodule remained on the dielectric layer in process of forming the epitaxy layer; and removing the nodule by using an ultrashort laser beam.

20 Claims, 5 Drawing Sheets

MANUFACTURING METHOD FOR A SEMICONDUCTOR STRUCTURE

BACKGROUND

In process of forming epitaxy, amorphous nodule is easily to remain on a dielectric layer. However, such amorphous nodule forms a hindrance to the subsequently formed material. Thus, how to remove the amorphous nodule is a goal for those of ordinary skill in the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
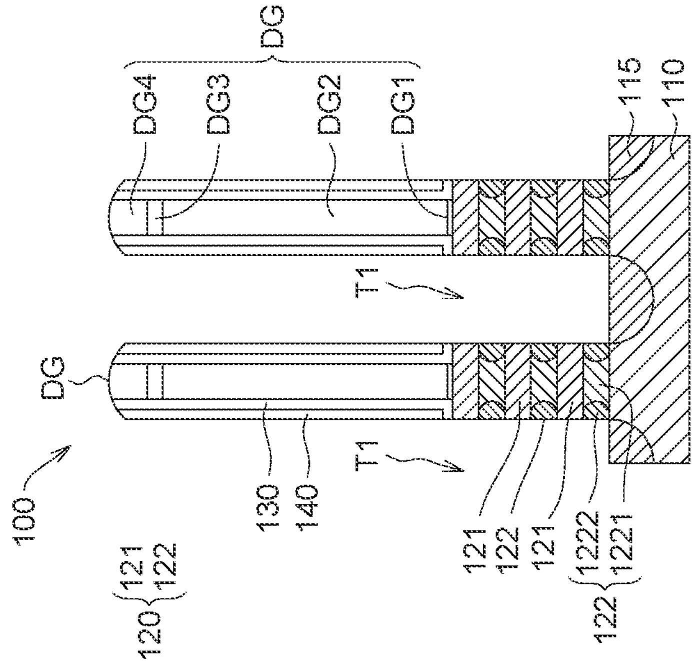
FIGS. 1A to 1D illustrate schematic diagrams of manufacturing processes of a semiconductor structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
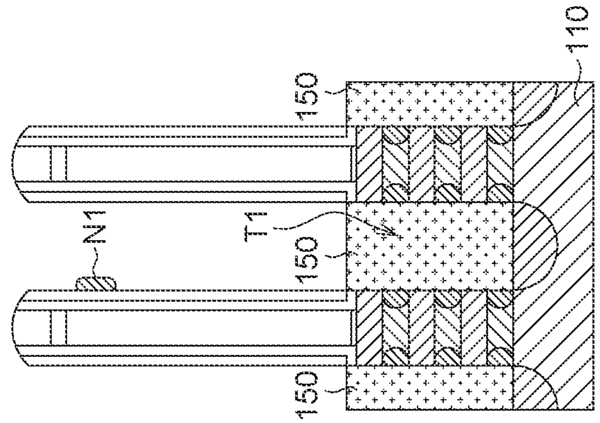
Figure 1C:
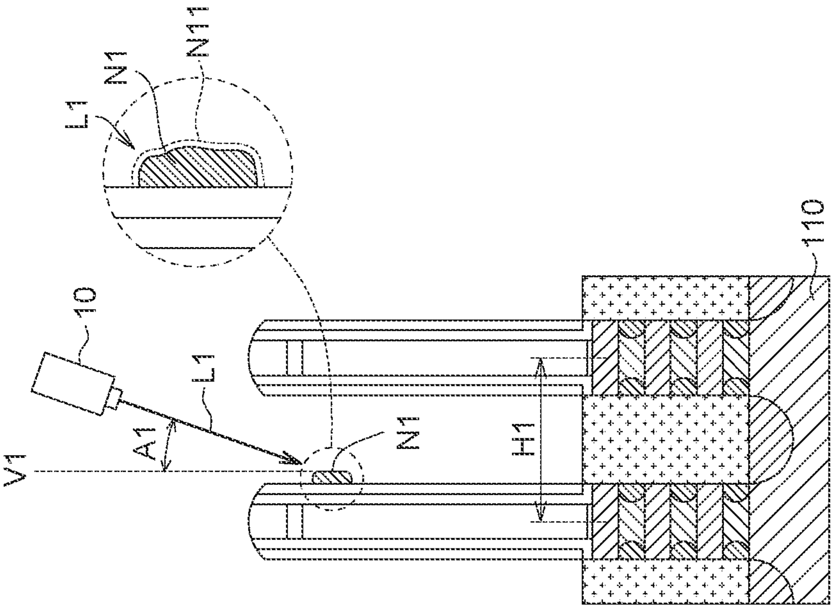
Figure 1D:
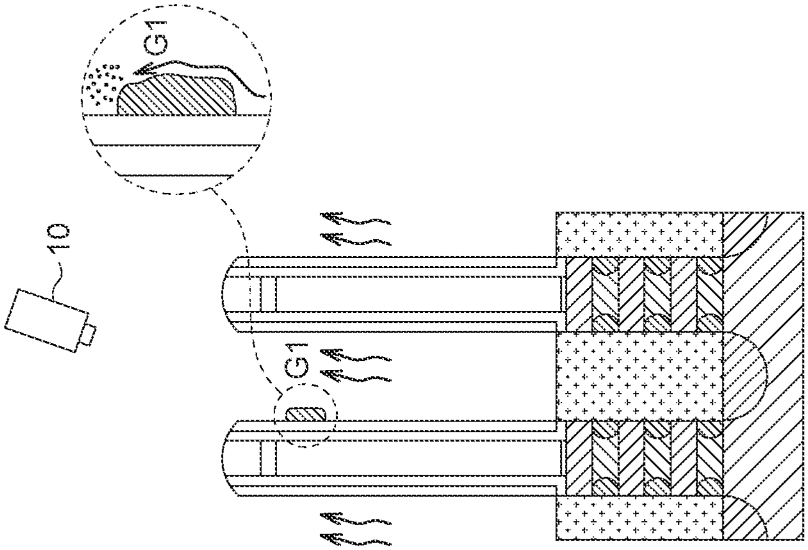
Figure 2:
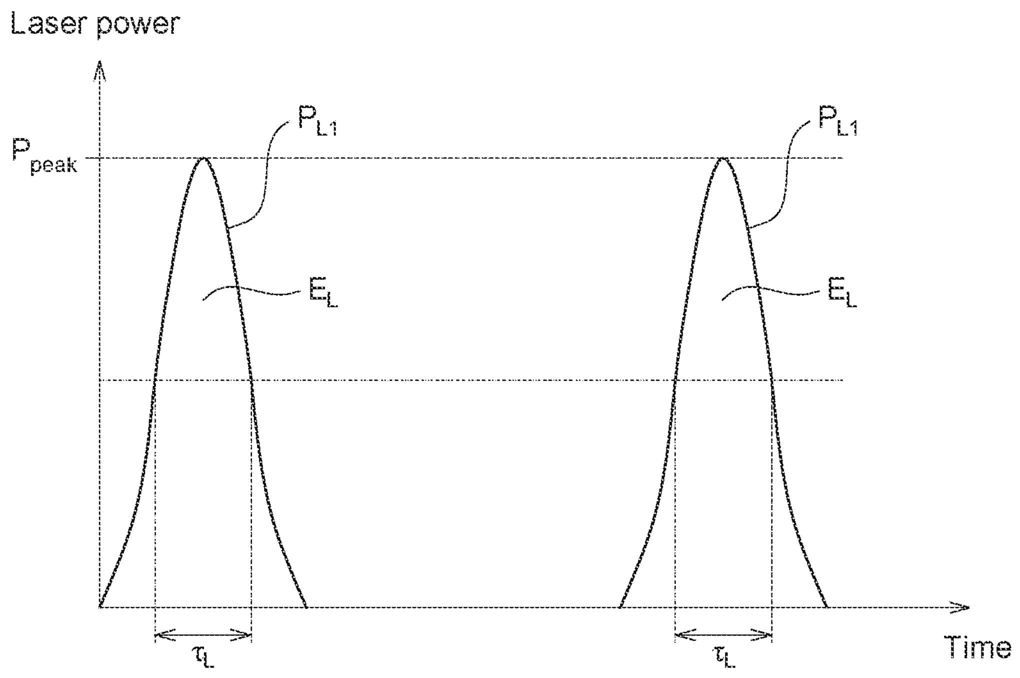
FIG. 2 illustrates a schematic diagram of a relationship between time vs. laser power according to an embodiment of the present disclosure.
Figure 3:
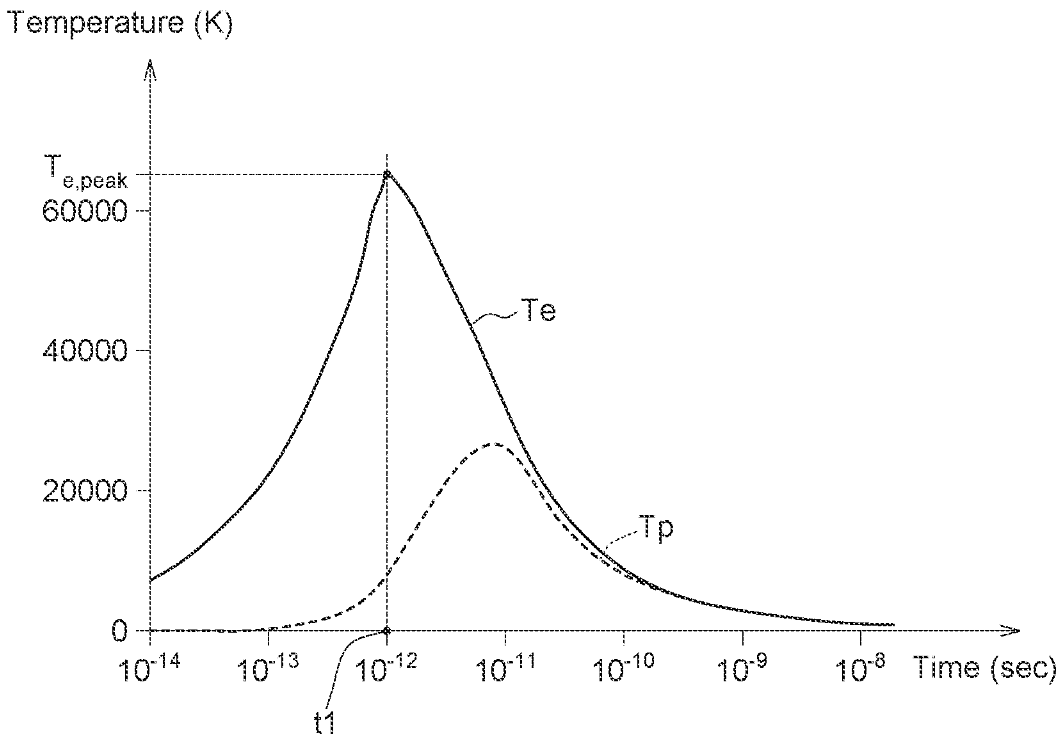
FIG. 3 illustrates a schematic diagram of a relationship between time vs. temperature of the semiconductor structure to which an ultrashort laser beam L1 is applied.
Figure 4:
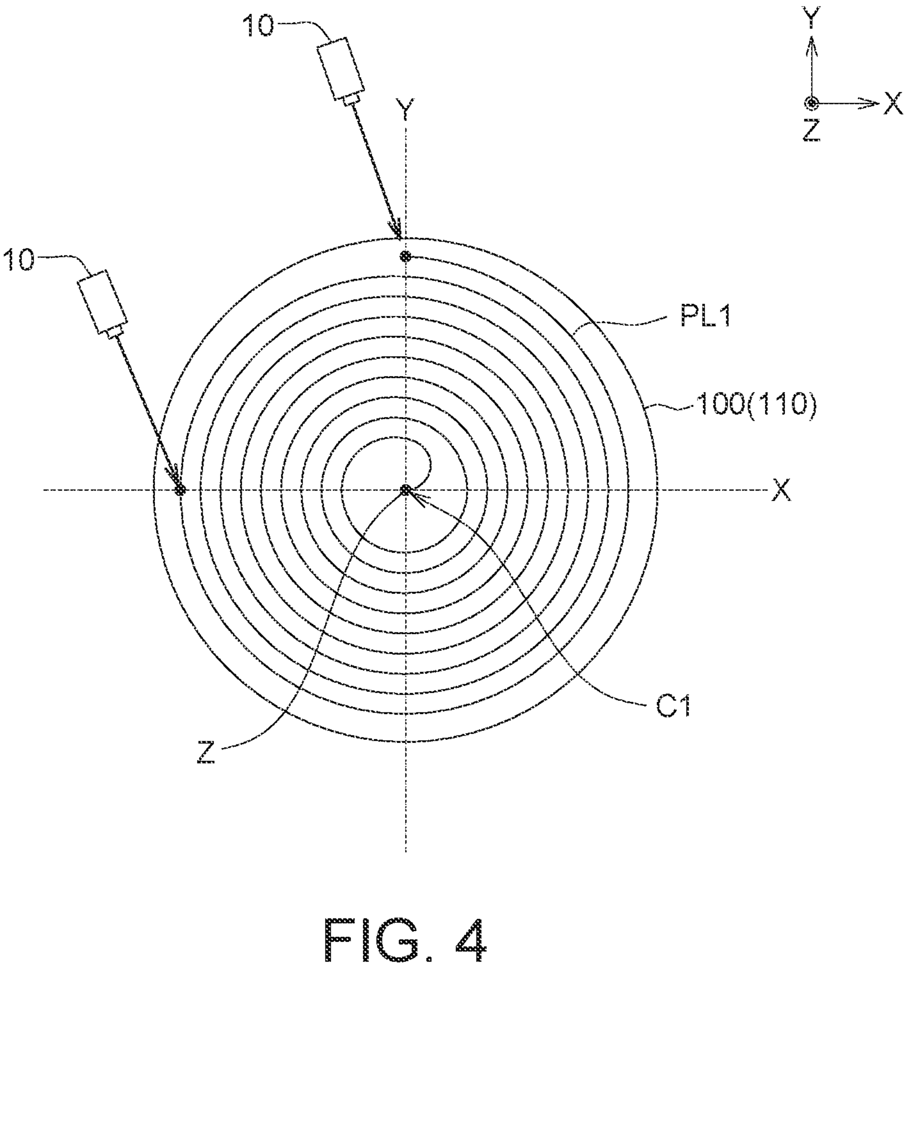
FIG. 4 illustrates a schematic diagram of two ultrashort laser emitters scanning the semiconductor structure.

As illustrated in FIGS. 1A to 4, FIGS. 1A to 1D illustrate schematic diagrams of manufacturing processes of a semiconductor structure 100 according to an embodiment of the present disclosure, FIG. 2 illustrates a schematic diagram of a relationship between time vs. laser power according to an embodiment of the present disclosure, FIG. 3 illustrates a schematic diagram of a relationship between time vs. temperature of the semiconductor structure 100 to which an ultrashort laser beam L1 is applied, and FIG. 4 illustrates a schematic diagram of two ultrashort laser emitters 10 scanning the semiconductor structure 100.

As illustrated in FIG. 1A, a semiconductor structure 100 is formed, wherein the semiconductor structure 100 includes a wafer 110 and a plurality of dummy gates DG, wherein the dummy gates DG are formed on the wafer 110. Furthermore, the semiconductor structure 100 further includes at least one pure silicon layer 115, at least one active structure 120, at least one first dielectric layer 130 and at least one second dielectric layer 140.

As illustrated in FIG. 1A, the dummy gate DG is formed on the active structure 120. The dummy gate DG includes a dummy dielectric layer DG1, a dummy gate layer DG2, a mask layer DG3 and an oxide layer DG4. The dummy dielectric layer DG1 is formed on the fin structures. The dummy dielectric layer DG1 is formed of a material including, for example, silicon oxide, silicon nitride, a combination thereof, or the like, and may be deposited or thermally grown according to acceptable techniques. The dummy gate layer DG2 is formed over the dummy dielectric layer DG1, and the mask layer DG3 is formed over the dummy gate layer DG2. The dummy gate layer DG2 may be deposited over the dummy dielectric layer DG1 and then planarized, such as by CMP. The mask layer DG3 may be deposited over the dummy gate layer DG2. The dummy gate layer DG2 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer DG2 may be deposited by physical vapor deposition (PVD), CVD, sputter deposition, or other techniques for depositing the selected material. The dummy gate layer DG2 may be formed of other materials that have a high etching selectivity from the etching of isolation regions. The mask layer DG3 may include, for example, silicon nitride, silicon oxynitride, or the like.

As illustrated in FIG. 1A, the active structure 120 is formed on the wafer 110 and includes a plurality of active channel sheet 121 and a plurality of spacer layers 122. The active channel sheet 121 may be formed of a material including silicon. Each spacer layer 122 is formed between adjacent two of the active channel sheets 121. Each spacer layer 122 includes a SiGe (silicon-germanium) portion 1221 and at least one inner spacer 1222, and the inner spacer 1222 is formed on a lateral surface of the SiGe portion 1221. There is a trench T1 formed between adjacent two of the active structures 120.

As illustrated in FIG. 1A, the first dielectric layer 130 is formed above the active structure 120 and on a lateral surface of the dummy gates DG. The second dielectric layer 140 is formed on the first dielectric layer 130. The first dielectric layer 130 may be formed from a material including one of SiO, SiN, SiOC, SiON and SiOCN, and the second dielectric layer 140 may be formed from a material including another of SiO, SiN, SiOC, SiON and SiOCN.

As illustrated in FIG. 1A, at least one pure silicon layer 115 is formed (or backfills) within a bottom of the corresponding trench T1 by using, for example, epitaxy process.

As illustrated in FIG. 1B, a plurality of the epitaxies 150 is formed on the pure silicon layers 115 within the trenches T1 by using, for example, epitaxy process. In epitaxy process, a plurality of nodules N1 (for example, amorphous Si or amorphous SiGe) may be formed on or remain on sidewall of the second dielectric layer 140 formed on the dummy gate DG. The nodules N1 may hinder a material formed subsequently.

As illustrated in FIGS. 1C and 1D, the nodule N1 may be removed by using an ultrashort laser beam L1. As a result, the material formed subsequently will not be blocked by the nodule N1.

In FIG. 1C, the ultrashort laser beam L1 may be emitted by an ultrashort laser emitter 10. The ultrashort laser beam L1 irradiates the nodule N1 to make at least a portion (a removed portion N11) of the nodule N1 be damaged. In FIG. 1D, the removed portion N11 may be removed from the second dielectric layer 140 by using, for example, a flowing gas G1. The flowing gas G1 is, for example, hydrogen or an inert gas such as Nitrogen (N2). The processes of FIGS. 1C and 1D may be repeated until the entire of or most of the nodule N1 is removed.

In addition, due to the ultrashort laser beam L1, an etching process for the nodule N1 is not required. In other words, etchant (for example, HCL, $Cl_2$) is not required in removing of the nodule N1.

In FIG. 1C, the ultrashort laser emitter 10 may be obliquely incident to the nodule N1. Furthermore, most of the nodules N1 are formed on an upper portion of the second dielectric layer 140. The nodules N1 formed on the upper portion of the second dielectric layer 140 may be irradiated due to the ultrashort laser emitter 10 being obliquely incident to the nodule N1. In an embodiment, an angle A1 included between a vertical axis VI (substantial parallel to an extension (or a height) direction of the dummy gates DG) and the ultrashort laser beam L1 ranges between 10 degree and 80 degree, such as 10 degree, 20 degree, 30 degree, 40 degree, 50 degree, 60 degree, 70 degree or 80 degree. The narrower the pitch HI between adjacent two of the active structures 120 is, the less the angle A1 is.

As illustrated in FIG. 2, each ultrashort laser beam L1 is emitted according to a pulse signal $P_{L1}$. According to the pulse signal $P_{L1}$, each ultrashort laser beam L1 is emitted in a pulse duration $\tau_L$ and generates a laser pulse energy $E_L$. A peak power $P_{peak}$ of the ultrashort laser beam L1 may be obtained according to the formula (1), and a laser peak intensity $I_{peak}$ on the beam axis may be obtained according to formula (2), In formula (2), $\omega_r$ represents a radius from the laser beam axis where the optical intensity drops to $1/e^2$ (≈13.5%) of the value on the beam axis.

$$P_{peak} \approx 0.94\frac{E_L}{\tau_L} \tag{1}$$

$$I_{peak} = \frac{2 \times P_{peak}}{\pi \times \omega_r^2} \tag{2}$$

In the present embodiment, the ultrashort laser beam L1 is applied to the nodule N1 in the pulse duration $\tau_L$, and the pulse duration $\tau_L$ is in ps (picosecond) level or fs (femtosecond) level. For example, the pulse duration $\tau_L$ is less than, for example, 100 picoseconds. For ultrashort pulse lasers with pulse duration in the picosecond time domain or femtosecond time domain, the peak power $P_{peak}$ may be extremely high, usually in the gigawatt (GW) range.

As illustrated in FIG. 3, an electron temperature curve $T_e$ represents a temperature change trend of electrons (free electrons) in the nodule N1, and a lattice temperature curve $T_p$ represents a temperature change trend of lattices (metallographic structure) in the nodule N1. Due to the pulse duration $\tau_L$ with the picosecond time domain or femtosecond time domain, the removed portion N11 raises to a peak temperature $T_{e,peak}$ at a time point t1 which the pulse ends. At the time point t1, the lattice temperature is much lower than the electron temperature. It means that the high temperature does not occur in the nodule and the semiconductor structure 100. However, due to the sufficiently high peak power, the surface (for example, the removed portion N11 in FIG. 1C) of the nodule N1 still may be removed (for example, vaporized).

Furthermore, the laser energy is usually absorbed by the free electrons and bound electrons in materials. The high energy electrons share their energy among other electrons rapidly through electron-electron collisions (electron-electron scattering) in a timescale of $10^{-15}$ to $10^{-13}$ seconds, and the temperature of the electron subsystem increases during this process. In the present embodiment, due to the pulse duration $\tau_L$ being less than 100 picoseconds, the energy is merely absorbed by the surface (for example, the removed portion N11) of the nodules N1, and thus the semiconductor structure 100 in process of removing the nodule N1 does not suffer from high heat problems.

As shown in formulas (1) and (2), the laser peak intensity $I_{peak}$ and the peak power $P_{peak}$ is only related to time duration, not related to wavelength of the laser beam. In other words, the nodule N1 is removed in a non-linear absorption mold. In non-linear absorption mold, the laser wavelength of the ultrashort laser beam L1 is not limited. However, in linear absorption mold, the wavelength of the laser beam larger than Si bandgap is required.

Furthermore, non-linear absorption process is two-photon absorption (TPA). Here, the energies of two photons are combined to excite a single electron into a higher state—e.g. above the even when the energy of a single photon is insufficient for getting across the band gap. The effective absorption is proportional to the optical intensity.

In addition, a laser peak fluence $F_{peak}$ corresponding to the laser peak intensity $I_{peak}$ is greater than an ablation fluence $F_{ab}$ of the nodule N1. The laser peak fluence $F_{peak}$ may be obtained according to the formula (3).

$$F_{peak} = \frac{2 \times E_L}{\pi \times \omega_r^2} \tag{3}$$

Furthermore, as shown in Table below, for fiber laser, the ablation fluence $F_{ab}$ of silicon (amorphous nodules N1) is 0.12 J/cm$^2$, the ablation fluence $F_{ab}$ of germanium (amorphous nodules N1) is 0.08 J/cm$^2$, and the ablation fluence $F_{ab}$ of the second dielectric layer 140 is 2.9 J/cm$^2$. For Ti: sapphire, the ablation fluence $F_{ab}$ of silicon is 0.1 J/cm$^2$, the ablation fluence $F_{ab}$ of germanium is 0.075 J/cm$^2$, and the ablation fluence $F_{ab}$ of the second dielectric layer 140 is 3.6 J/cm$^2$. The ablation fluence $F_{ab}$ of the second dielectric layer 140 is greater than the ablation fluence $F_{ab}$ of the amorphous nodules N1, and less than ablation fluence $F_{ab}$ of the second dielectric layer 140. In the present embodiment, the laser peak fluence $F_{peak}$ corresponding to the laser peak intensity $I_{peak}$ may range between the ablation fluence $F_{ab}$ of the nodules N1 and the ablation fluence $F_{ab}$ of the second dielectric layer 140. As a result, after laser ablation, the nodules N1 is removed, but the second dielectric layer 140 is not damaged (the dielectric damage free) or slightly damaged. In other words, the dielectric spacer loss is controllable in the present embodiment.

TABLE 1

| material | type | |
|---|---|---|
| | fiber laser ($J/cm^2$) | Ti: sapphire ($J/cm^2$) |
| germanium | 0.08 | 0.078 |
| silicon | 0.12 | 0.1 |
| $SiO_2$ | 2.9 | 3.6 |

As illustrated in FIG. 4, in removing the nodule by using the ultrashort laser beam L1, the ultrashort laser beam L1 scans spirally between a center C1 of the wafer 110 and an outer circle of the wafer 110. In other words, a scan path $P_{L1}$ of the ultrashort laser beam L1 is spiral-shape. Furthermore, the semiconductor structure 100 is rotates about Z axis, one of the ultrashort laser emitters 10 scans the semiconductor structure 100 in X axis, and another of the ultrashort laser emitters 10 scans the semiconductor structure 100 in Y axis.

The inner circle of the structure is usually easier to accumulate heat than the outer circle of the structure and thus it results in high temperature. However, as illustrated in FIG. 4, since the semiconductor structure 100 in process of removing the nodule N1 does not suffer from high heat problems, the ultrashort laser emitter 10 may scan the center C1 of the semiconductor structure 100. As a result, the nodule in the inner circle of the semiconductor structure 100 may be completely removed.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a manufacturing method for a semiconductor structure includes the following steps: removing the nodule which is remained on the dielectric layer of the active structure by using the ultrashort laser beam. Due to the ultrashort laser beam, the semiconductor structure in process of removing the nodule does not suffer from high heat problem.

Example embodiment 1: a manufacturing method includes the following steps: forming a semiconductor structure, wherein the semiconductor structure includes a wafer, a plurality of dummy gates and a dielectric layer, and the dummy gates are formed on the wafer, and the dielectric layer is formed on the dummy gates; forming an epitaxy layer between adjacent two of the dummy gates, wherein there is a nodule remained on the dielectric layer in process of forming the epitaxy layer; and removing the nodule by using an ultrashort laser beam.

Example embodiment 2 based on Example embodiment 1: in removing the nodule by using the ultrashort laser beam, there is no etchant required for the nodule.

Example embodiment 3 based on Example embodiment 1: in removing the nodule by using the ultrashort laser beam, the ultrashort laser beam is obliquely incident to the nodule.

Example embodiment 4 based on Example embodiment 1: in removing the nodule by using the ultrashort laser beam, the ultrashort laser beam scans spirally between a center of the wafer and an outer circle of the wafer.

Example embodiment 5 based on Example embodiment 1: in removing the nodule by using the ultrashort laser beam, the ultrashort laser beam is applied to the nodule in a pulse duration, and the pulse duration is less than 100 picoseconds.

Example embodiment 6 based on Example embodiment 1: in removing the nodule by using the ultrashort laser beam, the ultrashort laser beam has a laser peak intensity, and a laser peak fluence corresponding to the laser peak intensity is greater than an ablation fluence of the nodule.

Example embodiment 7 based on Example embodiment 1: in removing the nodule by using the ultrashort laser beam, the ultrashort laser beam has a laser peak intensity, and a laser peak fluence corresponding to the laser peak intensity is less than an ablation fluence of the dielectric layer.

Example embodiment 8: a manufacturing method includes the following steps: forming a semiconductor structure, wherein the semiconductor structure includes a wafer, a plurality of dummy gates and a dielectric layer, and the dummy gates are formed on the wafer, and the dielectric layer is formed on the dummy gates; forming an epitaxy layer between adjacent two of the dummy gates, wherein there is a nodule remained on the dielectric layer in process of forming the epitaxy layer; and removing the nodule by using a laser beam, wherein the laser beam is applied to the nodule in a pulse duration, and the pulse duration is less than 100 picoseconds.

Example embodiment 9 based on Example embodiment 8: in removing the nodule by using the laser beam, there is no etchant required for the nodule.

Example embodiment 10 based on Example embodiment 9: in removing the nodule by using the laser beam, the laser beam is obliquely incident to the nodule.

Example embodiment 11 based on Example embodiment 8: in removing the nodule by using the laser beam, the laser beam scans spirally between a center of the wafer and an outer circle of the wafer.

Example embodiment 12 based on Example embodiment 8: in removing the nodule by using the laser beam, the laser beam has a laser peak intensity, and a laser peak fluence corresponding to the laser peak intensity is greater than an ablation fluence of the nodule.

Example embodiment 13 based on Example embodiment 8: in removing the nodule by using the laser beam, the laser beam has a laser peak intensity, and a laser peak fluence corresponding to the laser peak intensity is less than an ablation fluence of the dielectric layer.

Example embodiment 14: a manufacturing method includes the following steps: forming a semiconductor structure, wherein the semiconductor structure includes a wafer, a plurality of dummy gates and a dielectric layer, and the dummy gates are formed on the wafer, and the dielectric layer is formed on the dummy gates; forming an epitaxy layer between adjacent two of the dummy gates, wherein there is a nodule remained on the dielectric layer in process of forming the epitaxy layer; and removing the nodule by using a laser beam, wherein a removed portion of the nodule raises to a peak temperature at a time point, and a lattice temperature of the nodule is lower than an electron temperature of the nodule at the time point.

Example embodiment 15 based on Example embodiment 14: in removing the nodule by using the laser beam, there is no etchant required for the nodule.

Example embodiment 16 based on Example embodiment 14: in removing the nodule by using the laser beam, the ultrashort laser beam is obliquely incident to the nodule.

Example embodiment 17 based on Example embodiment 14: in removing the nodule by using the laser beam, the laser beam scans spirally between a center of the wafer and an outer circle of the wafer.

Example embodiment 18 based on Example embodiment 14: in removing the nodule by using the laser beam, the laser beam is applied to the nodule in a pulse duration, and the pulse duration is less than 100 picoseconds.

Example embodiment 19 based on Example embodiment 14: in removing the nodule by using the laser beam, the laser beam has a laser peak intensity, and a laser peak fluence corresponding to the laser peak intensity is greater than an ablation fluence of the nodule.

Example embodiment 20 based on Example embodiment 14: in removing the nodule by using the laser beam, the laser beam has a laser peak intensity, and a laser peak fluence corresponding to the laser peak intensity is less than an ablation fluence of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method, comprising:

forming a semiconductor structure, wherein the semiconductor structure comprises a wafer, a plurality of dummy gates and a dielectric layer, and the dummy gates are formed on the wafer, and the dielectric layer is formed on the dummy gates;

forming an epitaxy layer between adjacent two of the dummy gates, wherein there is a nodule remained on the dielectric layer in process of forming the epitaxy layer; and removing the nodule by using an ultrashort laser beam.

2. The manufacturing method as claimed in claim 1, wherein in removing the nodule by using the ultrashort laser beam, there is no etchant required for the nodule.

3. The manufacturing method as claimed in claim 1, wherein in removing the nodule by using the ultrashort laser beam, the ultrashort laser beam is obliquely incident to the nodule.

4. The manufacturing method as claimed in claim 1, in removing the nodule by using the ultrashort laser beam, the ultrashort laser beam scans spirally between a center of the wafer and an outer circle of the wafer.

5. The manufacturing method as claimed in claim 1, wherein in removing the nodule by using the ultrashort laser beam, the ultrashort laser beam is applied to the nodule in a pulse duration, and the pulse duration is less than 100 picoseconds.

6. The manufacturing method as claimed in claim 1, wherein in removing the nodule by using the ultrashort laser beam, the ultrashort laser beam has a laser peak intensity, and a laser peak fluence corresponding to the laser peak intensity is greater than an ablation fluence of the nodule.

7. The manufacturing method as claimed in claim 1, wherein in removing the nodule by using the ultrashort laser beam, the ultrashort laser beam has a laser peak intensity, and a laser peak fluence corresponding to the laser peak intensity is less than an ablation fluence of the dielectric layer.

8. A manufacturing method, comprising:

forming a semiconductor structure, wherein the semiconductor structure comprises a wafer, a plurality of dummy gates and a dielectric layer, and the dummy gates are formed on the wafer, and the dielectric layer is formed on the dummy gates;

forming an epitaxy layer between adjacent two of the dummy gates, wherein there is a nodule remained on the dielectric layer in process of forming the epitaxy layer; and removing the nodule by using a laser beam, wherein the laser beam is applied to the nodule in a pulse duration, and the pulse duration is less than 100 picoseconds.

9. The manufacturing method as claimed in claim 8, wherein in removing the nodule by using the laser beam, there is no etchant required for the nodule.

10. The manufacturing method as claimed in claim 8, wherein in removing the nodule by using the laser beam, the laser beam is obliquely incident to the nodule.

11. The manufacturing method as claimed in claim 8, in removing the nodule by using the laser beam, the laser beam scans spirally between a center of the wafer and an outer circle of the wafer.

12. The manufacturing method as claimed in claim 8, wherein in removing the nodule by using the laser beam, the laser beam has a laser peak intensity, and a laser peak fluence corresponding to the laser peak intensity is greater than an ablation fluence of the nodule.

13. The manufacturing method as claimed in claim 8, wherein in removing the nodule by using the laser beam, the laser beam has a laser peak intensity, and a laser peak fluence corresponding to the laser peak intensity is less than an ablation fluence of the dielectric layer.

14. A manufacturing method, comprising:

forming a semiconductor structure, wherein the semiconductor structure comprises a wafer, a plurality of dummy gates and a dielectric layer, and the dummy gates are formed on the wafer, and the dielectric layer is formed on the dummy gates;

forming an epitaxy layer between adjacent two of the dummy gates, wherein there is a nodule remained on the dielectric layer in process of forming the epitaxy layer; and removing the nodule by using a laser beam, wherein a removed portion of the nodule raises to a peak temperature at a time point, and a lattice temperature of the nodule is lower than an electron temperature of the nodule at the time point.

15. The manufacturing method as claimed in claim 14, wherein in removing the nodule by using the laser beam, there is no etchant required for the nodule.

16. The manufacturing method as claimed in claim 14, wherein in removing the nodule by using the laser beam, the ultrashort laser beam is obliquely incident to the nodule.

17. The manufacturing method as claimed in claim 14, in removing the nodule by using the laser beam, the laser beam scans spirally between a center of the wafer and an outer circle of the wafer.

18. The manufacturing method as claimed in claim 14, wherein in removing the nodule by using the laser beam, the laser beam is applied to the nodule in a pulse duration, and the pulse duration is less than 100 picoseconds.

19. The manufacturing method as claimed in claim 14, wherein in removing the nodule by using the laser beam, the laser beam has a laser peak intensity, and a laser peak fluence corresponding to the laser peak intensity is greater than an ablation fluence of the nodule.

20. The manufacturing method as claimed in claim 14, wherein in removing the nodule by using the laser beam, the laser beam has a laser peak intensity, and a laser peak fluence corresponding to the laser peak intensity is less than an ablation fluence of the dielectric layer.

* * * * *